United States Patent [19]
Hilgers

[11] Patent Number: 4,582,659
[45] Date of Patent: Apr. 15, 1986

[54] METHOD FOR MANUFACTURING A FUSIBLE DEVICE FOR USE IN A PROGRAMMABLE THICK FILM NETWORK

[75] Inventor: John L. Hilgers, Milwaukee, Wis.
[73] Assignee: Centralab, Inc., Milwaukee, Wis.
[21] Appl. No.: 692,089
[22] Filed: Jan. 17, 1985

Related U.S. Application Data
[62] Division of Ser. No. 555,847, Nov. 28, 1983.
[51] Int. Cl.⁴ .............................................. B29C 39/12
[52] U.S. Cl. ...................................... 264/61; 29/623; 29/832
[58] Field of Search .................... 29/623, 832; 264/60, 264/61; 337/142, 233, 290

[56] References Cited
U.S. PATENT DOCUMENTS
3,401,452  9/1968  Ragan ................................... 29/623
3,564,354  2/1971  Aoki et al. ............................ 29/623

Primary Examiner—Donald Czaja
Assistant Examiner—V. Fischbach
Attorney, Agent, or Firm—Norman N. Spain

[57] ABSTRACT

An energy sensitive fusible device fabricated by thick film techniques in which a fuse element is sandwiched between two glazes on a substrate, for use in programming thick film networks.

3 Claims, 7 Drawing Figures

METHOD FOR MANUFACTURING A FUSIBLE DEVICE FOR USE IN A PROGRAMMABLE THICK FILM NETWORK

This is a division of application Ser. No 555,847, filed Nov. 28, 1983.

BACKGROUND OF THE INVENTION

1. Field of the Invention

A fusible device for programmable thick film networks used in attenuators, voltage dividers and similar circuits made by sandwiching a narrow thick film metal strip between two layers of dielectric glaze or glass. This energy sensing device has a low initial resistance and a very high open circuit resistance.

2. Description of the Prior Art

Fusible devices are well known in the prior art, their exact construction being a function of their application or use in a circuit. In many cases it is desirable to use thick film fusible devices for setting levels of attenuation in attenuators or fine tuning in voltage dividers. However, prior art devices have had several drawbacks. Some have had too low a resistance. Others have had restrictions on materials. Still others have been of a thin film type.

A typical example of a presision electric fuse is disclosed in U.S. Pat. No. 3,401,452. This patent discloses a composite metal-glass fuse element having an electrically-conductive fuse metal extending between and electrically connecting spaced-apart fuse electrodes, and a layer of electrically insulating glass covering the metal layer in intimate contact therewith for quenching the fuse metal after it has been blown by a current overload, whereby arcs which tend to develop across the blown metal are effectively suppressed. The object of this patented device was to provide a precision miniature electrical fuse which produces a fast and decisive break at the rated breaking current. The fuse will remain intact through long periods of operation and only ruptures in the event of an overload. In contrast, the fuse of the present invention is intended to be intentionally blown for the purpose of programming a circuit. While similar in construction to this prior art patent, the fuse of the present invention differs in several notable respects.

SUMMARY OF THE INVENTION

The object of the present invention is to provide a precision miniature fusible device which is energy sensitive and to provide a method of manufacturing such a fusible device using well known thick film materials and techniques. Such a fusible device must have a very low initial resistance and a very high resistance after it is blown. The objects of the invention are realized by the use of a sandwich-type construction which allows post-fusing resistance in excess of $1 \times 10^{10}$ ohms and typically greater than $1 \times 10^{13}$ ohms. Without the sandwich-type construction post-fusing resistances as low as $1 \times 10^5$ ohms are common due to the incomplete melting of the metal array or redeposition of the metal after vaporization.

The device is formed by screening a layer of dielectric glass or glaze on an alumina substrate, air drying the glaze and then firing the glaze at 850° C. to 1000° C. for five to ten minutes. A thick film conductor paste in the form of a desired fuse pattern is then applied in such a manner that a narrow part of the pattern straddles the glazed layer. The conductor paste is then air dried. A final layer of glaze is applied over the first layer of glaze and the narrow segment of the conductor pattern. The final layer of glaze and the conductor material are then co-fired at 800° to 900° C. The resulting fuse element will blow or melt away when exposed to continuous high current or to an instantaneous high energy surge. The current or energy needed to cause the fusing action is dependent on the width of the metal conductor.

The use of the sandwich-type construction has several advantages. The substrate may be any material which will support thick film circuitry, in contrast to several prior art fusible devices which have limitations on substrate materials. The glaze may be a nonorganic dielectric compatible with thick film techniques, including all commercially available cross-over materials. The conductor may be any noble or non-noble conductive material or resistive material. The conductor pattern can be of any geometry and of any width. Under certain circumstances, the bottom layer of glaze may be eliminated. This would be a function of compatibility of materials.

DESCRIPTION OF THE PREFERRED EMBODIMENT

Figure 1:
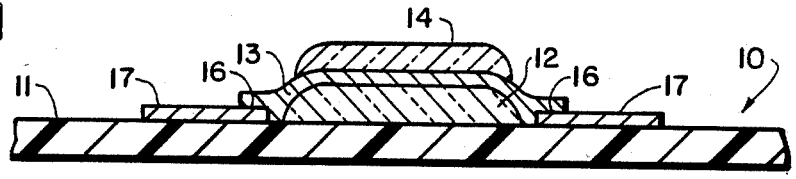
FIG. 1 is a cross-sectional view of the thick fuse element of the present invention deposited on a substrate.

FIG. 1 is a cross-sectional view of a thick film fuse device made by sandwiching a narrow thick film metal strip between two layers of a dielectric glaze or glass. Fuse 10 is formed by screening a layer of dielectric glass or glaze 12 on an alumina substrate 11. The substrate 11 may be any material which will support thick film circuitry, such as steatite, porcelainezed steel or beryllia. After deposition of the glaze 12 on substrate 11, the glaze is air dried and then fired at 850° to 1000° C. for five to ten minutes.

Figure 2:
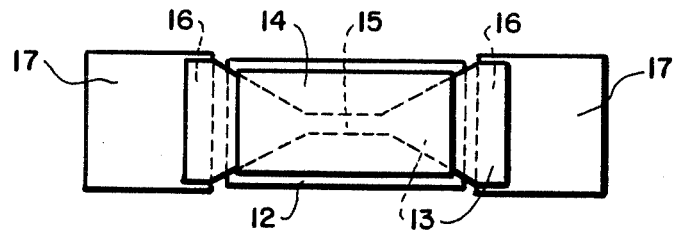
FIG. 2 is a top plan view of a conductive pattern which may used in the thick film fuse element of FIG. 1.

Thereafter, a thick film conductor paste 13 in the form of the pattern shown in FIG. 2 is then applied in such a manner that the narrow part of the pattern 15 (typically 0.004 inches to 0.010 inches wide) straddles the glaze layer 12. The fuse terminal portions 16 are in the form of pads or projections extending perpendicularly to the narrow portion 15 which constitutes the fuse electrode. The fuse terminal portions 16 are in physical and electrical contact with conventional terminations 17. Thus, a convergent path of high conductivity is provided. If the terminations 17 are of a different material than the fuse element 13, it is usually desirable to screen and fire the termination material to the substrate prior to deposition of the first layer of dielectric glaze 12. The conductor paste 13 is then air dried. A final layer of glaze 14 is applied over the first layer of glaze and the narrow segment 15 of the conductor pattern. The final layer of glaze 14 and the conductor material 13 are then co-fired at 800° to 900° C. The fuse element 13 is preferably palladium gold. The terminations 17 are preferably palladium silver.

The resulting fuse element 13 will blow or melt away when exposed to continuous high current or to an instantaneous high energy surge such as that provided by a charged electrolytic capacitor. The current or energy needed to cause the fusing action is dependent on the width of the metal conductor 15. A typical energy level needed to provide adequate rupture is about 8 to 10 joules for a 0.006" wide by 0.020" long palladium gold fuse element.

The glazes 12, 14 used may be a inorganic dielectric compatible with thick film techniques. This includes all commercially available cross-over materials. The conductor 13 may be any noble or non-noble conductor material or resistive materials. The conductor pattern may be of any geometry and of any width.

The most preferred substrate material 11 is 96% alumina ceramic. It is the most common and cost effective material for the construction of thick film networks. Other alumina ceramic formulations as well as beryllia and steatite ceramic could also be used.

A lead-boro-silicate low temperature glass formulation such as those commonly used as crossover or multilayer dielectrics in thick film networks is the preferred dielectric glaze for deposition beneath and over the fuse element 13. Silk screening is the preferred method of application. The purpose of the lower layer of glaze 12 is to thermally isolate the fuse element from the ceramic substrate 11. The upper layer of glaze 14 confines the energy released into the fuse 13 causing a microexplosion which ruptures the overglaze. This rupture allows the vaporized metal of the fuse element to escape and promotes a significant break in the fuse element itself. This accounts for the high open circuit resistance which is characteristic of this invention.

The preferred metal components for the fuse element are either all palladium gold or a combination of palladium-silver and palladium-gold. Palladium silver is preferred for the terminating pads 17 of the fuse element because of its lower cost and compatability with common thick film resistor materials. This latter item is essential when fabricating programmable networks.

Palladium-gold is the preferred metal for the fuse element 13 itself because it provides a higher open circuit resistance and once blown is much less susceptable to metal migration under high humidity conditions than silver or silver bearing alloys. Both palladium-silver and palladium-gold are common, commercially available thick film conductor formulations. Other thick film conductor materials such as platinum-silver, platinum-gold, or gold could also be used.

The invention thus provides a fusible device 10 and a method of manufacturing this fusible device using thick film materials and technologies. The fuse element 13 must have a very low initial resistance and a very high resistance after it is blown. The novel sandwich-type construction allows post-fusing resistance in excess of $1 \times 10^{10}$ ohms and typically greater than $1 \times 10^{13}$ ohms. Without the sandwich-type construction, post-fusing resistances as low as $1 \times 10^5$ ohms are common due to incomplete melting of the metal or redeposition of the metal after vaporization.

When constructing electronic circuits with critical or precision performance parameters it is necessary to adjust certain components within the circuit to compensate for the tolerances of other components within the circuit. Most often the component selected for adjustment is a resistor. Common adjustment techniques include hand selecting a resistor from a range of values and soldering it into the circuit or including a variable resistor or trimmer resistor in the circuit that can be adjusted to provide the desired circuit performance. These methods tend to be cumbersome or costly.

Figure 3:
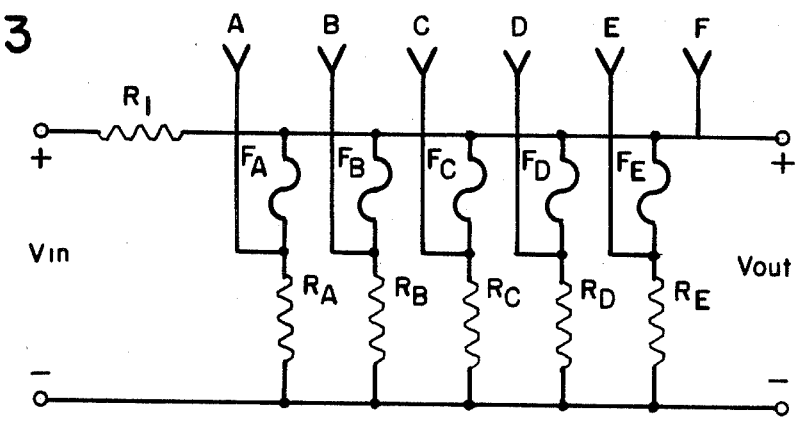
FIG. 3 is a circuit diagram of a programmable voltage regulator incorporating the present invention.

One application of this invention is to fabricate thick film fusable elements in series with thick film resistors in such a manner so that when the resulting resistor/fuse network is contained within an electronic circuit the performance of the circuit can be changed to the desired level by selectively blowing the appropriate fuse elements. The voltage divider shown in FIG. 3 is a typical example.

Initially all fuse elements F$_A$ through F$_E$ are closed and $$V_{OUT} = \frac{R_T}{R_1 + R_T} V_{in}$$

where R$_T$ is the parallel combination of R$_A$ thru R$_E$.

By opening the appropriate or the appropriate combination of the fuse elements F$_A$ through F$_E$ the resistor(s) in series with the fuses(s) will be removed from the circuit and the value of V$_{OUT}$ will change correspondingly. For instance, if it is determined that the desired value of V$_{OUT}$ can be obtained by removing R$_D$ from the circuit, a large value capacitor can be discharged across programming terminals D and F and fuse element F$_D$ will blow open and R$_D$ will be disconnected from the circuit. V$_{OUT}$ wil now change as follows:

$$V_{OUT} = \frac{R_{T1}}{R_1 + R_{T1}} V_{in}$$

where R$_{T1}$ is the parallel combination of R$_A$, R$_B$, R$_C$ and R$_E$ only.

Figure 4:
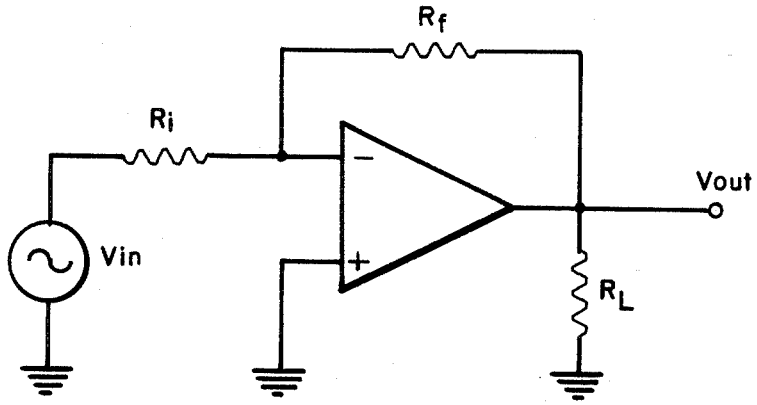
FIG. 4 is a circuit diagram of a standard inverting operational amplifier.

Likewise this fuse/resistor network can be used to set the gain of an operational amplifier, such as the inverting amplifier configuration shown in FIG. 4. The gain of this amplifier is established by the input and the feedback resistors as follows:

$$\text{Gain} = \frac{V_o}{V_{in}} = \frac{R_f}{R_i}$$

Figure 5:
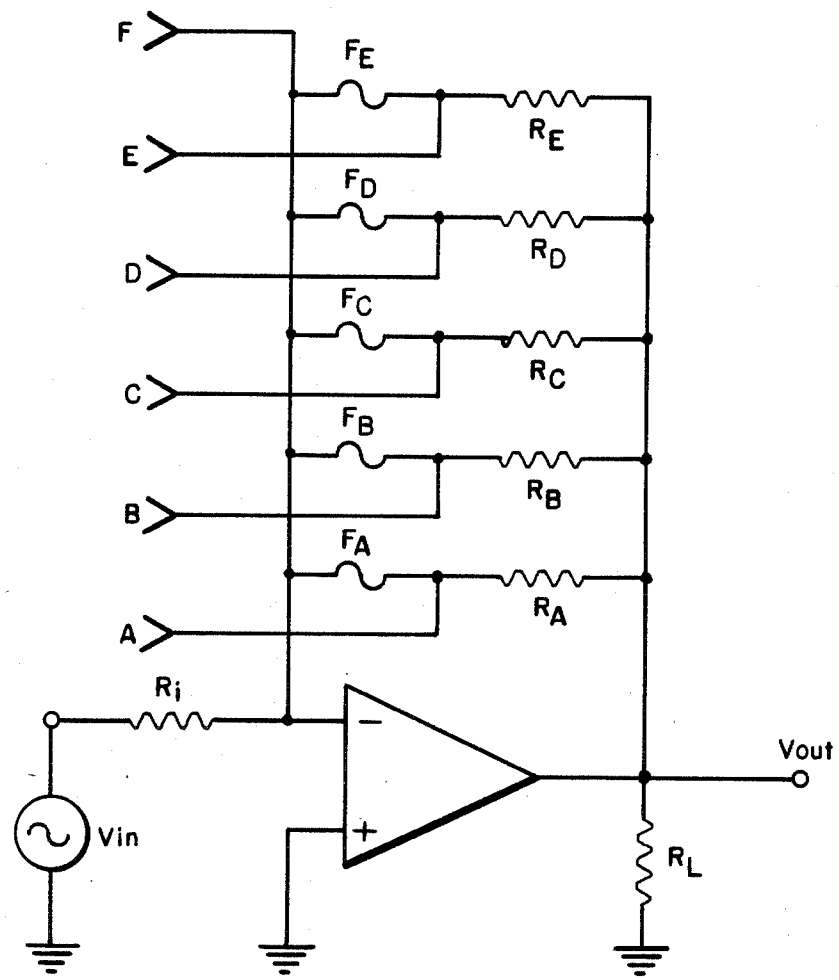
FIG. 5 is a circuit diagram of a programmable operational amplifier using the present invention.

By substituting a resistor/fuse network for R$_f$ as shown in FIG. 5, the gain can be programmed by blowing the appropriate fuse elements.

Although the above examples only show five resistor/fuse combinations in parallel, any number within reason could be so constructed.

A third example is the application of this invention to a programmable "O" pad type attenuator.

The telephone industry uses many "O" pad type attenuators to balance the signal level on incoming lines. These attenuators must be adjustable and typically cover the range of 0 to 1.5 db in 0.1 db increments or 0 to 15 db in 1 db steps. Several companies such as Bourns have in recent years introduced attenuators of this type mounted in DIP switch configurations. These attenuators are relatively expensive and the need for switches is questionable since the attenuation is usually a one time setting. The programmable approach provides the same function at a reduced cost.

Figure 6:
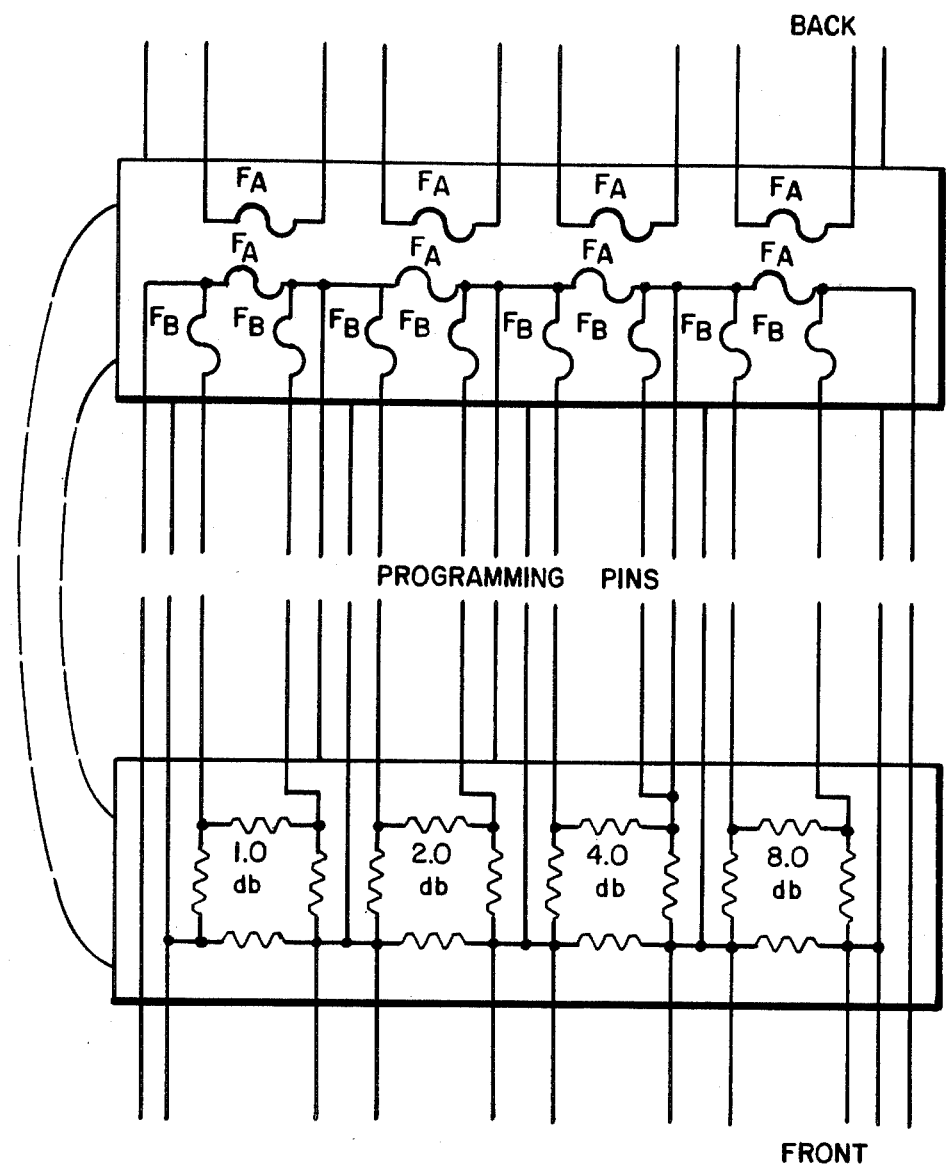
FIG. 6 is a schemmatic layout for a programmable thick film attenuator using the present invention.

FIG. 6 shows a feasible layout for a 0−15 db attenuator, which can be fabricated on a 2"×0.5" substrate. It is a single-in-line package with leads projecting from the top for programming purposes. All of the sixteen resistors (four balanced "0" pads) are screened on one side of the substrate and the fusable links on the other. Initially the module has no attenuation. To obtain 1 db attenuation, for example, the $F_A$ fuses for the 1 db pad and the $F_B$ fuses for the remaining three pads would be blown open. Other values of attenuation can be obtained by initially blowing the appropriate combination of $F_A$ and $F_B$ fuses. This basic construction can also be used to produce unbalanced "0" pads ($\pi$ configuration) and balanced ("H" pads) or unbalanced "T" pads.

Figure 7:
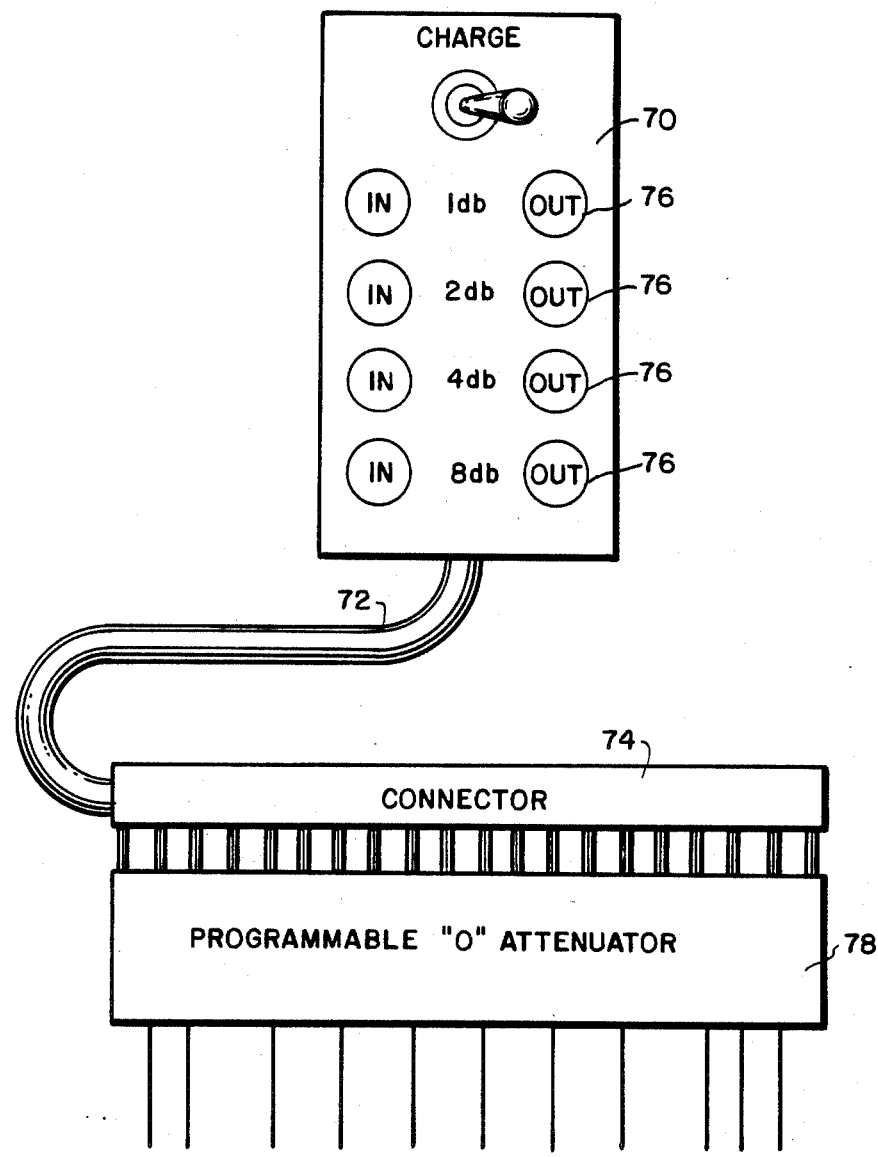
FIG. 7 is a block diagram of a method for programming the attenuator of FIG. 6.

Programming can be accomplished with a small box 70 containing a charged capacitor and a set of appropriately wired switches 76, as shown in FIG. 7. A cable 72 and connector 74 would extend from the control box. By mating the connector with the top leads of the module 78 and pressing the proper buttons, the attenuator can be quickly and readily programmed to the desired attenuation.

There are two notable limitations of this invention. First it is difficult to establish a blowing point with precision. Generally minimum energy levels are determined and energy pulses well in excess of the minimum are used to assure optimum rupture. Second, because it is desirable to rupture through the top layer of glaze, the devices are not recommended for use in volatile atmospheres.

I claim:

1. A method for the manufacture of a thick film fusible device for use in a programmable thick film network comprising the steps of:
    providing an electrically insulating substrate;
    applying thick film conductor termination pads either as an integral part of the fuse element or separate from the fuse element if a material other than the fuse element material is used for the terminations,
    screening a layer of dielectric glaze on said substrate;
    air drying said layer of dielectric glaze;
    firing said layer of dielectric glaze at 850° to 1000° C. for five to ten minutes;
    applying a thick film conductor paste in the form of a pattern of a fusible link to said substrate and said glaze layer in such a manner that the narrow part of the conductor pattern straddles the glaze layer;
    air drying said conductor paste;
    applying a second layer of said dielectric glaze over said first layer of glaze and the narrow segment of said conductor pattern to confine the conductor pattern so that high energy released to the fuse element will cause said second layer of glaze to rupture, releasing the conductor material and resulting in a high post fusing resistance;
    co-firing said second layer of glaze and said conductor material at 800° to 900° C.

2. The method of claim 1 further comprising the steps of:
    depositing a second thick film conductor paste of a second conductive material in the form of termination pads on said substrate prior to the deposition of the first layer of dielectric glaze; and
    firing said termination pads.

3. The method of claim 1 wherein the substrate is formed of alumina.

* * * * *